(12) United States Patent
Venugopal et al.

(10) Patent No.: US 10,734,040 B1
(45) Date of Patent: Aug. 4, 2020

(54) LEVEL-SHIFTING TRANSPARENT WINDOW SENSE AMPLIFIER

(71) Applicant: Apple Inc., Cupertino, CA (US)

(72) Inventors: Vivekanandan Venugopal, San Jose, CA (US); Ajay Bhatia, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/369,395

(22) Filed: Mar. 29, 2019

(51) Int. Cl.
| | |
|---|---|
| *G11C 7/00* | (2006.01) |
| *G11C 7/08* | (2006.01) |
| *H03K 3/037* | (2006.01) |
| *G11C 7/10* | (2006.01) |
| *G11C 7/22* | (2006.01) |
| *H03K 19/0185* | (2006.01) |

(52) U.S. Cl.
CPC ............... *G11C 7/08* (2013.01); *G11C 7/106* (2013.01); *G11C 7/1057* (2013.01); *G11C 7/222* (2013.01); *H03K 3/0372* (2013.01); *H03K 19/018521* (2013.01)

(58) Field of Classification Search
CPC ......... G11C 7/08; G11C 7/1057; G11C 7/106; G11C 7/222; G11C 7/225; H03K 3/0372; H03K 19/018521
See application file for complete search history.

(56) References Cited

U.S. PATENT DOCUMENTS

| | | | |
|---|---|---|---|
| 5,963,496 A | 10/1999 | Pathak et al. | |
| 6,137,319 A | 10/2000 | Krishnamurthy et al. | |
| 6,180,984 B1 * | 1/2001 | Golke | H01L 21/84 257/347 |
| 6,735,110 B1 * | 5/2004 | Lesea | G11C 11/4125 365/148 |
| 7,489,165 B2 | 2/2009 | Gans | |
| 8,736,304 B2 | 5/2014 | Boerstler et al. | |
| 9,036,446 B2 * | 5/2015 | Terzioglu | G11C 8/10 365/189.05 |
| 9,124,276 B2 | 9/2015 | Lin et al. | |
| 10,256,796 B2 * | 4/2019 | Hsin | H03K 3/35625 |
| 10,581,412 B1 * | 3/2020 | Venugopal | H03K 19/01852 |
| 2018/0047433 A1 * | 2/2018 | Kim | G11C 7/10 |

* cited by examiner

*Primary Examiner* — Toan K Le
(74) *Attorney, Agent, or Firm* — Kowert, Hood, Munyon, Rankin & Goetzel, P.C.

(57) ABSTRACT

Techniques are disclosed relating to level-shifting circuitry and time borrowing across voltage domains. In some embodiments, sense amplifier circuitry generates, based on an input signal at a first voltage level, an output signal at a second, different voltage level. Pulse circuitry may generate a pulse signal in response to an active clock edge of a clock signal that is input to the sense amplifier circuitry. Initial resolution circuitry may drive the output signal of the sense amplifier circuitry to match the value of the input signal during the pulse signal. Secondary resolution circuitry may maintain a current value of the output signal after expiration of the pulse signal. This may allow the input signal to change during the pulse, e.g., to enable time borrowing by upstream circuitry.

20 Claims, 7 Drawing Sheets

LEVEL-SHIFTING TRANSPARENT WINDOW SENSE AMPLIFIER

BACKGROUND

Technical Field

This disclosure relates generally to voltage level-shifting circuitry and more particularly to level-shifting circuitry with time borrowing.

Description of the Related Art

Time borrowing is a circuit technique in which edge-to-edge timing requirements are relaxed such that a longer combinational path can borrow some time from a shorter path in a subsequent stage. For example, an output signal from first circuitry borrowing from second circuitry may arrive after an active clock edge, but still be properly received by the second circuitry.

Circuits often include different voltage domains, with level-shifting circuitry between the domains. Sense amplifiers are one example of level shifting circuitry. For example, a sense amplifier may receive an input value at a relatively lower voltage from a memory cell and output the value at a relatively higher voltage to other circuitry.

Traditional circuitry does not allow time borrowing across voltage domains.

Figure 1:
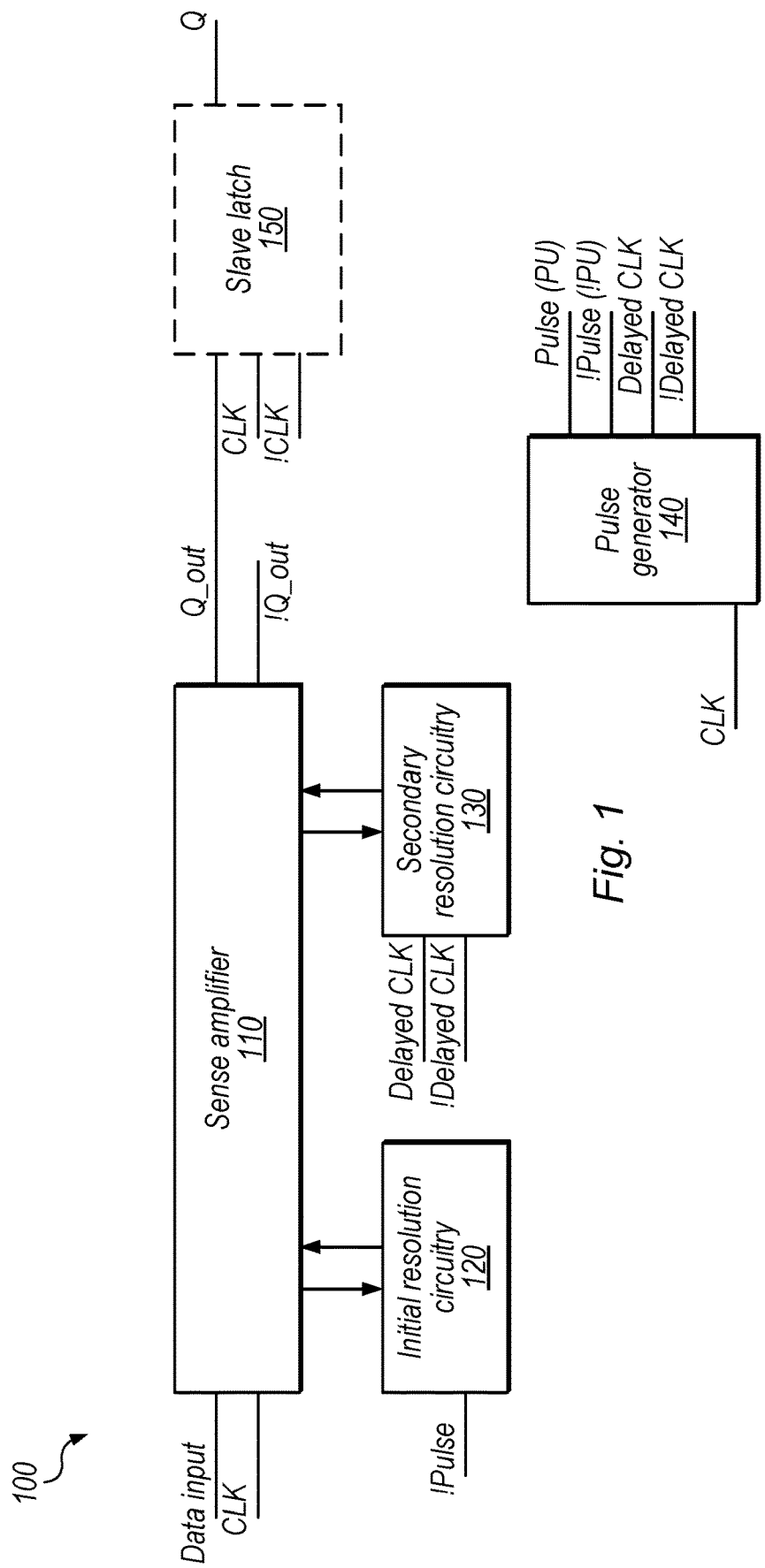
FIG. 1 is a block diagram illustrating example level-shifting circuitry that includes a sense amplifier, initial resolution circuitry, and secondary resolution circuitry, according to some embodiments.

This specification includes references to various embodiments, to indicate that the present disclosure is not intended to refer to one particular implementation, but rather a range of embodiments that fall within the spirit of the present disclosure, including the appended claims. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "level-shifting flip-flop" is intended to cover, for example, a circuit that performs this function during operation, even if the circuit in question is not currently being used (e.g., power is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function. After appropriate programming, the FPGA may then be configured to perform that function.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

Further, as used herein, the terms "first," "second," "third," etc. do not necessarily imply an ordering (e.g., temporal) between elements. For example, a referring to a "first" graphics operation and a "second" graphics operation does not imply an ordering of the graphics operation, absent additional language constraining the temporal relationship between these operations. In short, references such as "first," "second," etc. are used as labels for ease of reference in the description and the appended claims.

DETAILED DESCRIPTION

Overview of Time Borrowing Across Voltage Domains

In disclosed embodiments, a level-shifting sense amplifier is configured to operate based on an input signal at a first voltage level and generate an output at a second voltage level while allowing time borrowing. For example, pulse circuitry may generate a pulse signal beginning at an active clock edge, and the input to the level-shifting circuitry may be allowed to change during the pulse. Thus, the circuitry may transparently pass and level shift the input during the pulse, which may allow upstream circuitry to borrow time by changing its output during the pulse.

In some embodiments, initial resolution circuitry drives the output of the level-shifter during the pulse, but this initial resolution is a soft resolution that may change if the input changes during the pulse. In some embodiments, secondary resolution circuitry maintains the output after the pulse, and this resolution may be a hard resolution that does not change, at least until the next non-active clock edge, after which the sense amplifier may pre-charge. Examples of circuitry discussed herein include flip-flops and static to dynamic converters (SDCs), but the disclosed techniques are not limited to these specific circuit implementations.

FIG. 1 is a block diagram illustrating an example level shifting sense amplifier, according to some embodiments. In some embodiments, the sense amplifier is skew tolerant and implements a transparent window that allows time borrowing by upstream circuitry. In the illustrated embodiment, circuitry 100 includes sense amplifier 110, initial resolution circuitry 120, secondary resolution circuitry 130, and pulse generator 140. In some embodiments (e.g., flip flop implementations) circuitry 100 includes a slave latch 150.

Pulse generator 140, in the illustrated embodiment, is configured to generate a pulse signal PU, its inverse !PU, a delayed clock signal, and its inverse !delayed clock. In some embodiments, the pulse signal is high for an interval after an active clock edge and then remains low until the next active clock edge. In some embodiments, the active edge of the delayed clock signal corresponds to the end of the pulse. An example circuit implementation for pulse generator 140 is discussed in detail below with reference to FIG. 2A.

Sense amplifier 110, in some embodiments, is configured to receive a data input signal at a first voltage level and a clock signal and generate an output signal Q and its inverse !Q at a different voltage level. In other embodiments, sense amplifier 110 may generate a single output.

Initial resolution circuitry 120, in the illustrated embodiment, is configured to drive the output signal Q during the pulse to match the data input. In some embodiments, this allows the data input signal to change during the pulse (e.g., to enable time borrowing by an upstream path) and still be properly output. In the illustrated embodiment, initial resolution circuitry 120 operates based on the inverse of the pulse signal and may also receive inputs based on output nodes of the sense amplifier 110.

Secondary resolution circuitry 130, in the illustrated embodiment, is configured to maintain the level conversion after the pulse signal until the CLK falling edge, e.g., by cross-coupling outputs of the sense amplifier 110 to maintain the input signal. After the pulse, the initial resolution circuitry 120 may be tri-stated such that level shifting does not occur after the pulse. In the illustrated embodiment, secondary resolution circuitry 130 operates based on a delayed version of the clock signal (e.g., where an edge of the delayed version of the clock signal corresponds to an end of the pulse).

Note that various specific circuit examples discussed herein are included for purposes of illustration but are not intended to limit the scope of the present disclosure. As one example, complementary metal oxide (CMOS) transistor technology is shown in certain figures, but any of various other transistor technologies may be used. Similarly, various polarities of signals are shown but may be represented using other polarities in other embodiments. For example, the pulse signal may be a negative pulse, a positive pulse, or both. Similarly, the active clock edge may vary (e.g., may be the rising edge, falling edge, or both edges may be active).

Figure 2A:
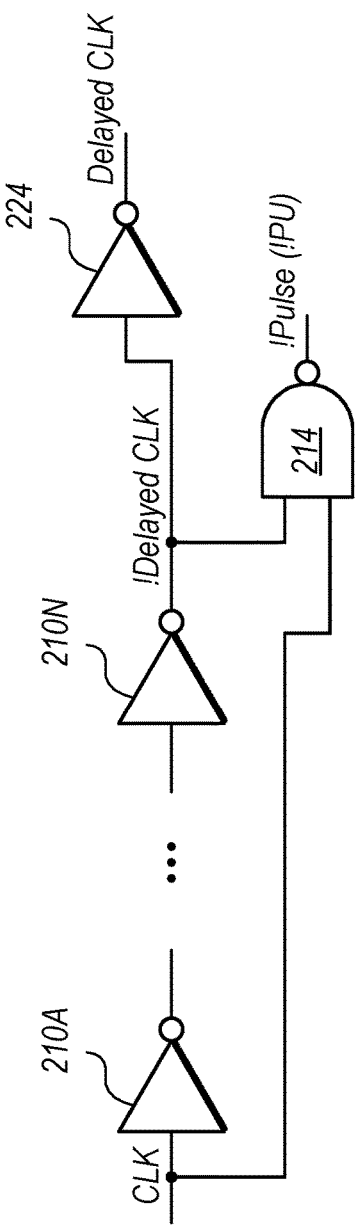
FIG. 2A is a circuit diagram illustrating example pulse circuitry, according to some embodiments.
Figure 2B:
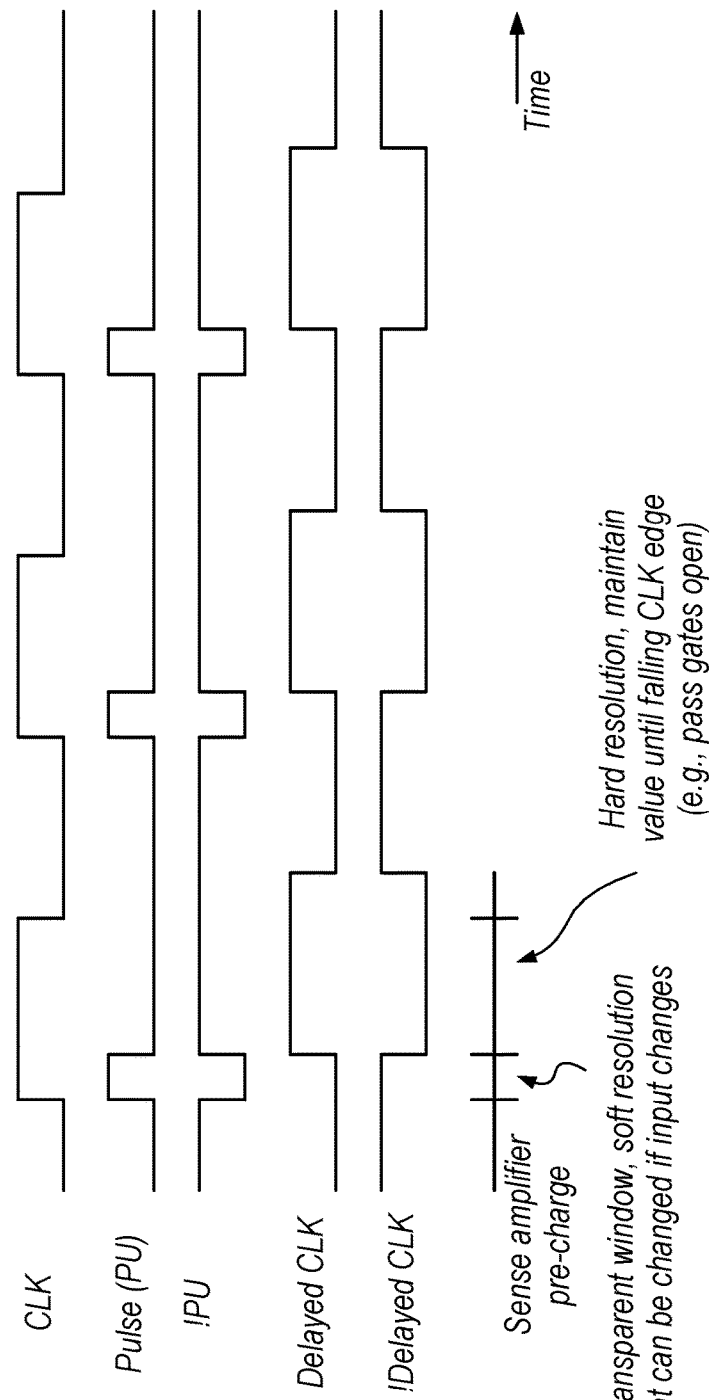
FIG. 2B is a timing diagram illustrating example clock and pulse signals, according to some embodiments.

FIG. 2A is a block diagram illustrating an example pulse generator circuit, according to some embodiments. In the illustrated embodiment, the pulse circuit includes multiple inverters 210A-210N, NAND gate 214, and inverter 224. FIG. 2B is a timing diagram illustrating example pulse signals and delayed clock signals generated by the circuitry of FIG. 2A, according to some embodiments. In the illustrated embodiment, the rising clock edge is the active edge.

As shown, in response to the clock transitioning from low to high, NAND gate 214 generates an inverted pulse corresponding to the delay imposed by inverters 210A-210N. In the illustrated embodiment, delayed CLK and !delayed CLK are also delayed by inverters 210A-210N and therefore their edges approximately correspond to the end of the pulse signal. As discussed above, in some embodiments, the length of the pulse corresponds to the duration of a window in which time borrowing is allowed to occur.

In the illustrated embodiment of FIG. 2B, there are three intervals during a given clock cycle. Prior to the active clock edge, the sense amplifier pre-charges. Starting at the active clock edge and during the pulse, there is a transparent window in which a soft resolution can change if the input changes. After the pulse, there is a hard resolution until the next CLK falling edge, after which the sense amplifier may pre-charge again. In some embodiments, secondary resolution circuitry 130 opens one or more pass gates during this interval.

Example Level Shifting SDC that Allows Time Borrowing

Figure 3:
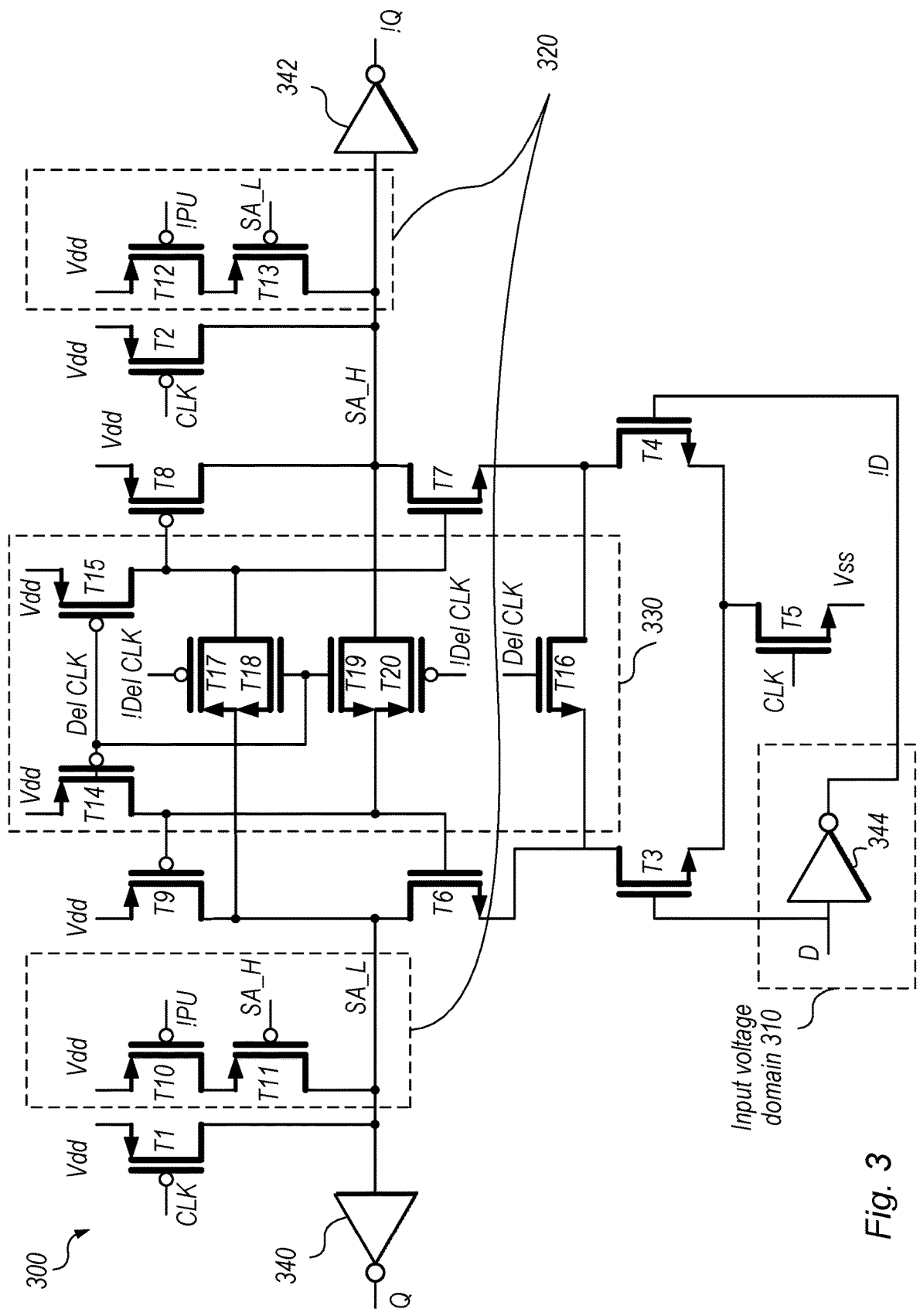
FIG. 3 is a transistor-level diagram illustrating an example level-shifting static to dynamic converter (SDC), according to some embodiments.

FIG. 3 is a circuit diagram illustrating an example level-shifting SDC circuit 300 that allows time borrowing, according to some embodiments. In the illustrated embodiment, circuit 300 includes transistors T1-T20 and inverters 340, 342, and 344. Circuit 300 receives a data input D, !PU, delayed clock, and !delayed clock and generates outputs Q and !Q.

As is well-understood by those skilled in the art, an SDC typically passes the data input through to the Q terminal when the clock is high and outputs a low signal on the Q terminal when the clock is low. Similarly, if a complimentary output such as !Q is implemented, the SDC inverts the data input on the !Q terminal when the clock is high but outputs a low signal on the !Q terminal when the clock is low. This converts a static data input signal into a dynamically encoded output, in some embodiments.

In the illustrated embodiment, the data input and inverter 344 are in the input voltage domain 310 while the remaining circuitry is in the output voltage domain corresponding to Vdd and Vss. Note that Vdd and Vss represent a supply voltage and a reference voltage respectively, with Vdd typically having a larger voltage than Vss (which may be a ground).

Circuitry 320 is one example of initial resolution circuitry 120, circuitry 330 is one example of secondary resolution circuitry 130, and the remaining circuitry of FIG. 3 implements sense amplifier functionality during at least a portion of a clock cycle.

Prior to the pulse signal, in the illustrated embodiment, the outputs of the sense amplifier SA_L and SA_H are pre-charged. In this situation, transistors T10, T12, and T17-T20 are off. Note that the terms "on" and "off" are used herein to indicate conducting and non-conducting states respectively, in disclosed embodiments in which transistors are used as three-terminal switches with a control terminal that controls whether the transistor conducts between the two other terminals.

During the pulse signal, in the illustrated embodiment, transistors T10 and T12 are on and transistors T17-T20 (which implement two pass gates) are off. In this situation, T14-T15 are also on, maintaining the gates of T6-T7 high and turning these transistors on. Thus, the input D and !D can change the states of SA_H and SA_L during the pulse signal. Therefore, during the pulse, circuitry 320 facilitates level shifting, but with a soft resolution such that the level-shifted outputs at SA_L and SA_H can change if the input data changes during the pulse (e.g., as driven by transistors T11 and T13).

After the pulse signal, transistors T10 and T12, transistors T14 and T15 are off and the pass gates open (transistors T17-T20 are on) and drive transistors T6 and T7. In this situation, in the illustrated embodiment, circuitry 330 cross-couples the output nodes SA_L and SA_H to maintain the current value at the proper output level until the CLK signal falls. After the CLK falling edge and prior to the delayed CLK signal falling, SA_H and SA_L may be pre-charged by T1 and T2, although the pass gates may remain open during this interval and keep transistors T6 and T7 on.

After the delayed CLK signal falls, the pass gates close and transistors T6 and T7 are driven by transistors T14 and T15 instead of the pass gates. When the CLK signal is low, transistors T1 and T2 properly drive both the !Q and Q outputs low to implement SDC functionality.

In the illustrated embodiment, circuitry 300 implements a level-shifting sense amplifier that allows the data input to change late, during the pulse, which may allow upstream circuitry to time borrow from circuitry 300.

Example Level Shifting Flip Flop that Allows Time Borrowing

Figure 4:
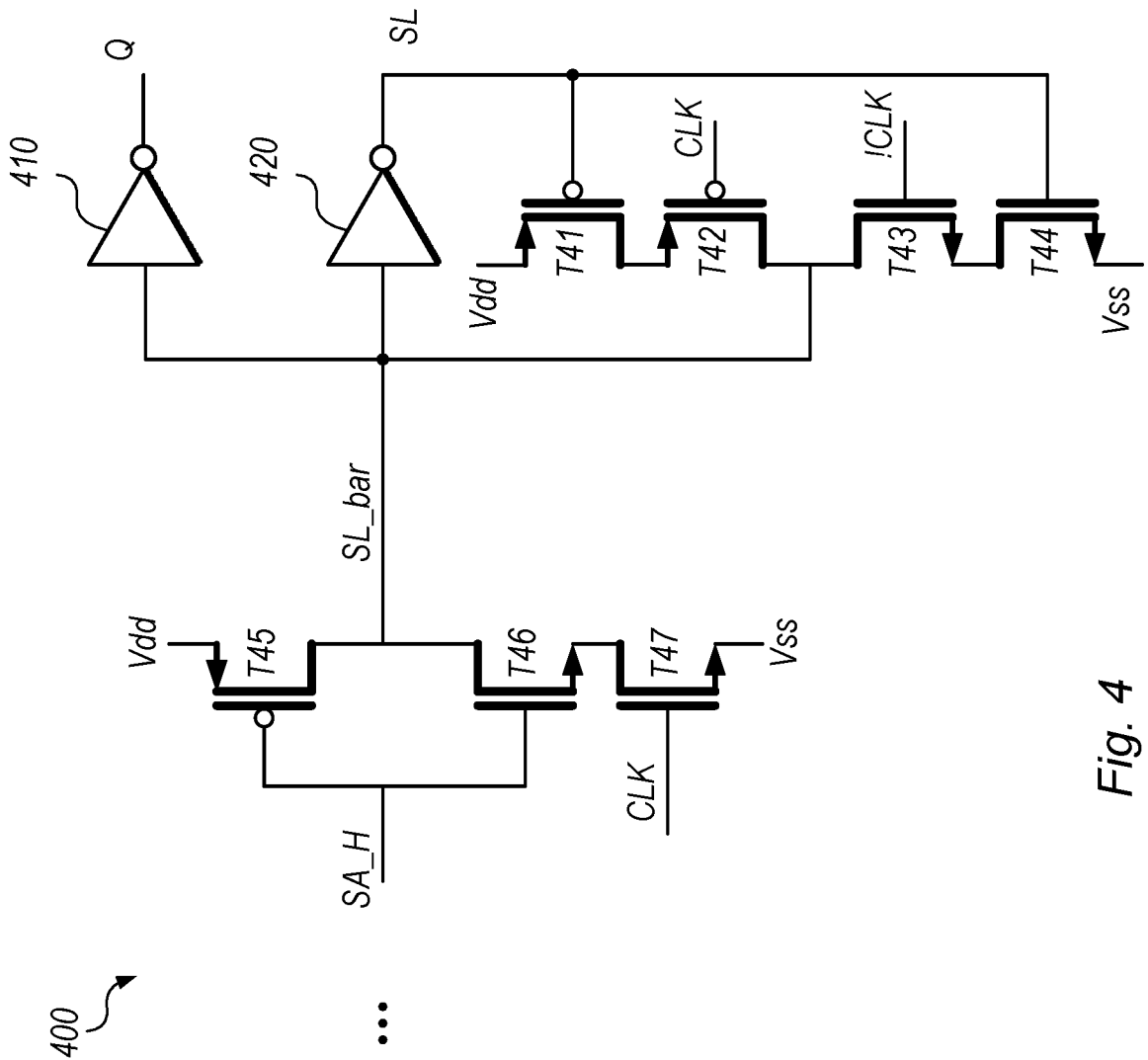
FIG. 4 is a transistor-level diagram illustrating an example slave latch for a level-shifting flip flop, according to some embodiments.

FIG. 4 is a circuit diagram illustrating an example slave latch for a level shifting flip flop circuit 400 that allows time borrowing, according to some embodiments. In the illustrated embodiment, circuit 400 receives the value of node SA_H (e.g., from circuitry 300 of FIG. 3 in place of inverter 342) and outputs a signal Q. In the illustrated embodiment, circuitry 400 includes inverters 410 and 420 and transistors T41-T47. As is well-understood by those skilled in the art, an edge-triggered flip flop typically stores the input value in response to an active clock edge and outputs that value until the next active clock edge.

Transistor T47, in the illustrated embodiment, enables the inverter formed by transistors T45 and T46 when the clock is high. Transistors T45 and T46, when enabled, provide the inverse of SA_H (SL_bar) to the inputs of inverters 410 and 420, while inverter 420 provides SL (the inverse of SL_bar) to transistors T41 and T42. When the clock is high, transistors T42 and T43 are off and do not affect Q. When the clock goes low, transistors T42 and T43 turn on and allow inverter 420 and transistors T41 and T44 to provide feedback to maintain the current value of Q.

Circuitry 400 is shown to illustrate one example modification to circuitry 300 that provides level-shifting flip flop functionality and allows time borrowing, but is not intended to limit the scope of the present disclosure.

Example Method

Figure 5:
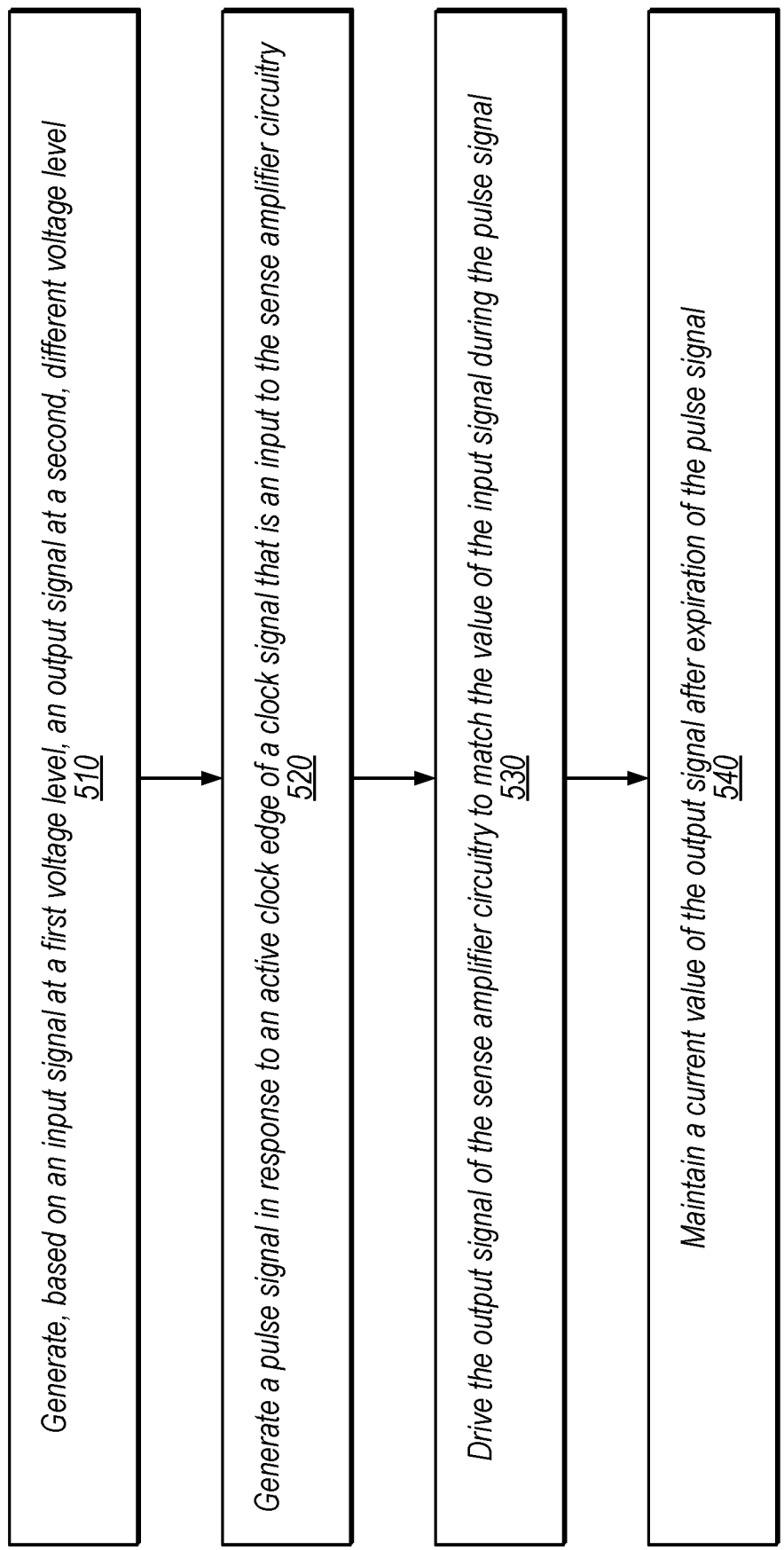
FIG. 5 is a flow diagram illustrating an example method for operating level-shifting circuitry, according to some embodiments.

FIG. 5 is a flow diagram illustrating a method 500 for operating a pulsed level shifting circuit, according to some embodiments. The method shown in FIG. 5 may be used in conjunction with any of the computer circuitry, systems, devices, elements, or components disclosed herein, among others. In various embodiments, some of the method elements shown may be performed concurrently, in a different order than shown, or may be omitted. Additional method elements may also be performed as desired.

At 510, in the illustrated embodiment, sense amplifier circuitry generates, based on an input signal at a first voltage level, an output signal at a second, different voltage level.

At 520, in the illustrated embodiment, pulse circuitry generates a pulse signal in response to an active clock edge of a clock signal that is an input to the sense amplifier circuitry.

At 530, in the illustrated embodiment, initial resolution circuitry drives the output signal of the sense amplifier circuitry to match the value of the input signal during the pulse signal. In some embodiments, the initial resolution circuitry includes a transistor stack (e.g., transistors T10 and T11) between a supply voltage and the output of the sense amplifier circuitry (e.g., SA_L) that are controlled by an inverse of the pulse signal and a value of an inverse terminal of the sense amplifier (e.g., SA_H).

At 540, in the illustrated embodiment, secondary resolution circuitry maintains a current value of the output signal after expiration of the pulse signal. In some embodiments, the secondary resolution circuitry includes first and second pass gates (e.g., implemented by transistors T17-T20) that provide feedback between output and inverse terminals of the sense amplifier and are controlled by a signal that represents an end of the pulse signal (e.g., Del CLK or !Del CLK).

In various embodiments, the disclosed techniques may allow time borrowing across voltage domains. For example, circuitry configured to generate the input signal at the first voltage level may time borrow from the sense amplifier circuitry by changing the input signal after the active clock edge and during the pulse signal.

Example Device

Figure 6:
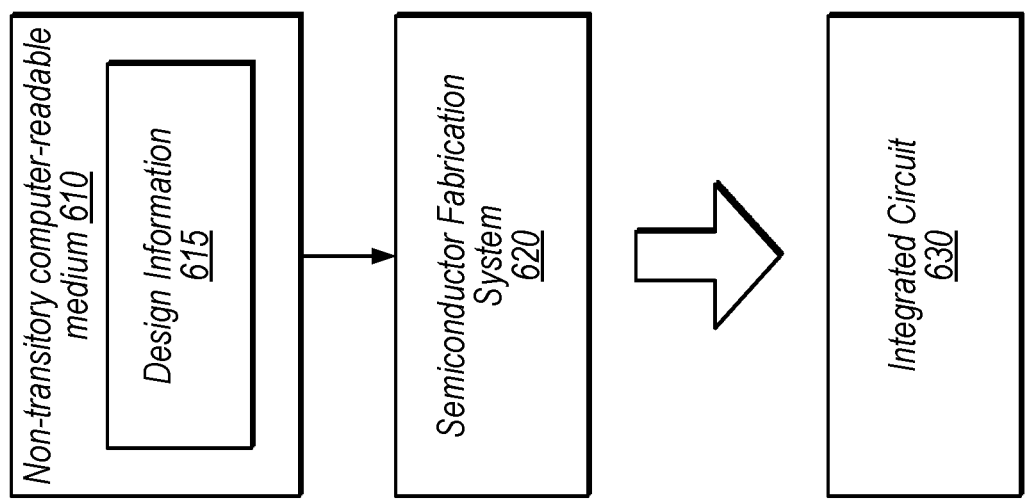
FIG. 6 is a block diagram illustrating an example computer-readable medium that stores circuit design information, according to some embodiments.

Referring now to FIG. 6, a block diagram illustrating an example embodiment of a device 600 is shown. In some embodiments, elements of device 600 may be included within a system on a chip. In some embodiments, device 600 may be included in a mobile device, which may be battery-powered. Therefore, power consumption by device 600 may be an important design consideration. In the illustrated embodiment, device 600 includes fabric 610, compute complex 620 input/output (I/O) bridge 650, cache/memory controller 645, graphics unit 670, and display unit 665. In some embodiments, device 600 may include other components (not shown) in addition to and/or in place of the illustrated components, such as video processor encoders and decoders, image processing or recognition elements, computer vision elements, etc.

The techniques disclosed herein may be utilized in various processors of various types of computing devices. For example, disclosed circuitry may be implemented in a memory controller, graphics unit, processor core, etc.

Fabric 610 may include various interconnects, buses, MUX's, controllers, etc., and may be configured to facilitate communication between various elements of device 600. In some embodiments, portions of fabric 610 may be configured to implement various different communication protocols. In other embodiments, fabric 610 may implement a single communication protocol and elements coupled to fabric 610 may convert from the single communication protocol to other communication protocols internally.

In the illustrated embodiment, compute complex 620 includes bus interface unit (BIU) 625, cache 630, and cores 635 and 640. In various embodiments, compute complex 620 may include various numbers of processors, processor cores and/or caches. For example, compute complex 620 may include 1, 2, or 4 processor cores, or any other suitable number. In one embodiment, cache 630 is a set associative L2 cache. In some embodiments, cores 635 and/or 640 may include internal instruction and/or data caches. In some embodiments, a coherency unit (not shown) in fabric 610, cache 630, or elsewhere in device 600 may be configured to maintain coherency between various caches of device 600. BIU 625 may be configured to manage communication between compute complex 620 and other elements of device 600. Processor cores such as cores 635 and 640 may be configured to execute instructions of a particular instruction set architecture (ISA) which may include operating system instructions and user application instructions.

Cache/memory controller 645 may be configured to manage transfer of data between fabric 610 and one or more caches and/or memories. For example, cache/memory controller 645 may be coupled to an L3 cache, which may in turn be coupled to a system memory. In other embodiments, cache/memory controller 645 may be directly coupled to a memory. In some embodiments, cache/memory controller 645 may include one or more internal caches.

As used herein, the term "coupled to" may indicate one or more connections between elements, and a coupling may include intervening elements. For example, in FIG. 6, graphics unit 670 may be described as "coupled to" a memory through fabric 610 and cache/memory controller 645. In contrast, in the illustrated embodiment of FIG. 6, graphics unit 670 is "directly coupled" to fabric 610 because there are no intervening elements.

Graphics unit 670 may include one or more processors and/or one or more graphics processing units (GPU's). Graphics unit 670 may receive graphics-oriented instructions, such as OPENGL®, Metal, or DIRECT3D® instructions, for example. Graphics unit 670 may execute specialized GPU instructions or perform other operations based on the received graphics-oriented instructions. Graphics unit 670 may generally be configured to process large blocks of data in parallel and may build images in a frame buffer for output to a display. Graphics unit 670 may include transform, lighting, triangle, and/or rendering engines in one or more graphics processing pipelines. Graphics unit 670 may output pixel information for display images. Programmable shader 675, in various embodiments, may include highly parallel execution cores configured to execute graphics programs, which may include pixel tasks, vertex tasks, and compute tasks (which may or may not be graphics-related).

Display unit 665 may be configured to read data from a frame buffer and provide a stream of pixel values for display. Display unit 665 may be configured as a display pipeline in some embodiments. Additionally, display unit 665 may be configured to blend multiple frames to produce an output frame. Further, display unit 665 may include one or more interfaces (e.g., MIPI® or embedded display port (eDP)) for coupling to a user display (e.g., a touchscreen or an external display).

I/O bridge 650 may include various elements configured to implement: universal serial bus (USB) communications, security, audio, and/or low-power always-on functionality, for example. I/O bridge 650 may also include interfaces such as pulse-width modulation (PWM), general-purpose input/output (GPIO), serial peripheral interface (SPI), and/or inter-integrated circuit (I2C), for example. Various types of peripherals and devices may be coupled to device 600 via I/O bridge 650.

Example Computer-Readable Medium

The present disclosure has described various example circuits in detail above. It is intended that the present disclosure cover not only embodiments that include such circuitry, but also a computer-readable storage medium that includes design information that specifies such circuitry. Accordingly, the present disclosure is intended to support claims that cover not only an apparatus that includes the disclosed circuitry, but also a storage medium that specifies the circuitry in a format that is recognized by a fabrication system configured to produce hardware (e.g., an integrated circuit) that includes the disclosed circuitry. Claims to such a storage medium are intended to cover, for example, an entity that produces a circuit design, but does not itself fabricate the design.

Figure 7:
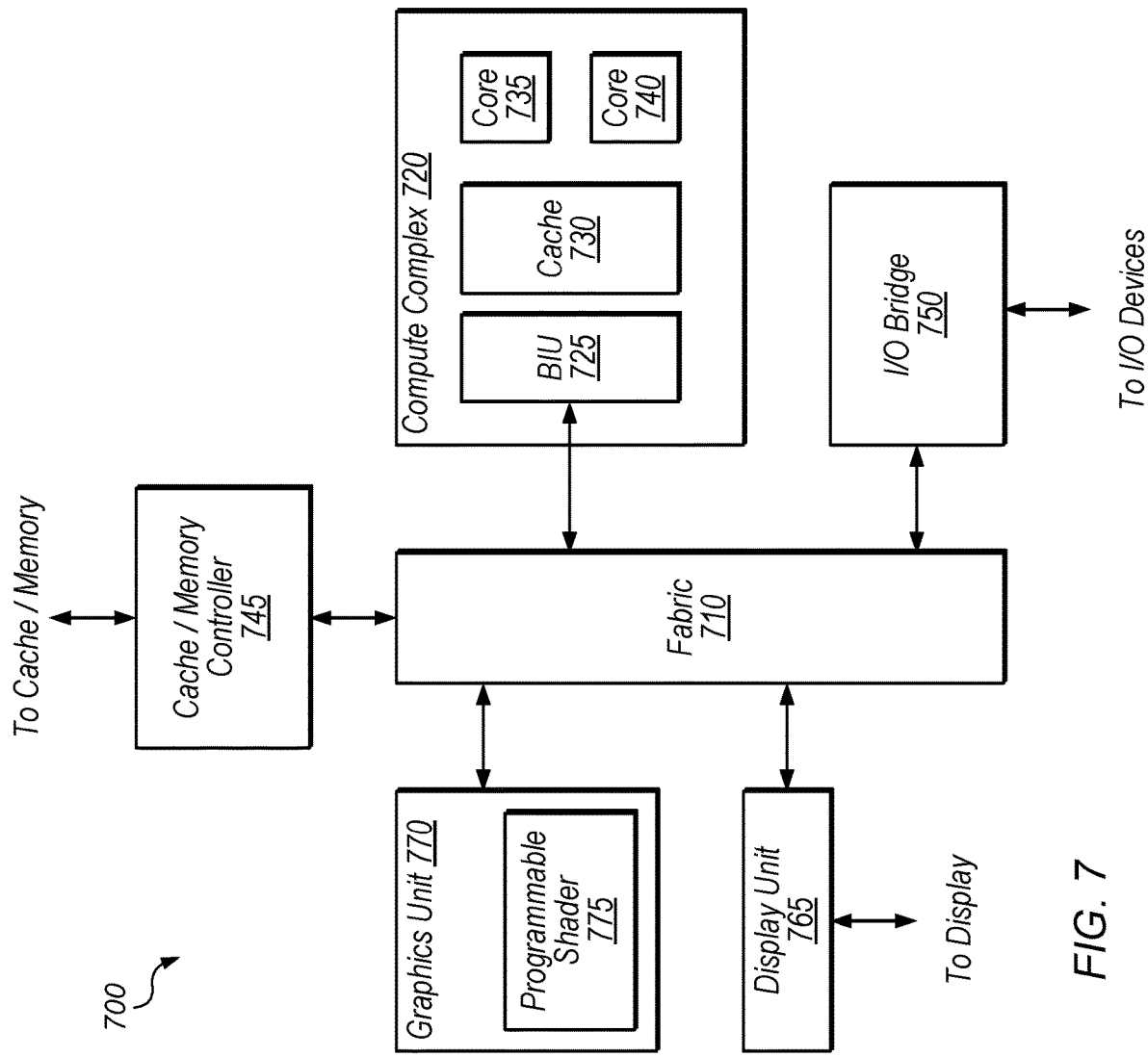
FIG. 7 is a block diagram illustrating an example computing device.

FIG. 7 is a block diagram illustrating an example non-transitory computer-readable storage medium that stores circuit design information, according to some embodiments. In the illustrated embodiment semiconductor fabrication system 720 is configured to process the design information 715 stored on non-transitory computer-readable medium 710 and fabricate integrated circuit 730 based on the design information 715.

Non-transitory computer-readable storage medium 710, may comprise any of various appropriate types of memory devices or storage devices. Non-transitory computer-readable storage medium 710 may be an installation medium, e.g., a CD-ROM, floppy disks, or tape device; a computer system memory or random access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 710 may include other types of non-transitory memory as well or combinations thereof. Non-transitory computer-readable storage medium 710 may include two or more memory mediums which may reside in different locations, e.g., in different computer systems that are connected over a network.

Design information 715 may be specified using any of various appropriate computer languages, including hardware description languages such as, without limitation: VHDL, Verilog, SystemC, SystemVerilog, RHDL, M, MyHDL, etc. Design information 715 may be usable by semiconductor fabrication system 720 to fabricate at least a portion of integrated circuit 730. The format of design information 715 may be recognized by at least one semiconductor fabrication system 720. In some embodiments, design information 715 may also include one or more cell libraries which specify the synthesis and/or layout of integrated circuit 730. In some embodiments, the design information is specified in whole or in part in the form of a netlist that specifies cell library elements and their connectivity. Design information 715, taken alone, may or may not include sufficient information for fabrication of a corresponding integrated circuit. For example, design information 715 may specify the circuit elements to be fabricated but not their physical layout. In this case, design information 715 may need to be combined with layout information to actually fabricate the specified circuitry.

Integrated circuit 730 may, in various embodiments, include one or more custom macrocells, such as memories, analog or mixed-signal circuits, and the like. In such cases, design information 715 may include information related to included macrocells. Such information may include, without limitation, schematics capture database, mask design data, behavioral models, and device or transistor level netlists. As used herein, mask design data may be formatted according to graphic data system (GDSII), or any other suitable format.

Semiconductor fabrication system 720 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 720 may also be configured to perform various testing of fabricated circuits for correct operation.

In various embodiments, integrated circuit 730 is configured to operate according to a circuit design specified by design information 715, which may include performing any of the functionality described herein. For example, integrated circuit 730 may include any of various elements shown in FIG. 1, 2A, 3, or 4. Further, integrated circuit 730 may be configured to perform various functions described herein in conjunction with other components. Further, the functionality described herein may be performed by multiple connected integrated circuits.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   sense amplifier circuitry configured to generate, based on an input signal at a first voltage level, an output signal at a second, different voltage level;
   pulse circuitry configured to generate a pulse signal in response to an active clock edge of a clock signal that is an input to the sense amplifier circuitry;
   initial resolution circuitry configured to drive the output signal of the sense amplifier circuitry to match the value of the input signal during the pulse signal; and
   secondary resolution circuitry configured to maintain a current value of the output signal after expiration of the pulse signal.

2. The apparatus of claim 1, wherein the sense amplifier circuitry, the pulse circuitry, the initial resolution circuitry, and the secondary resolution circuitry implement a level-shifting static to dynamic converter with a transparent window corresponding to the pulse signal.

3. The apparatus of claim 1, further comprising:
   a slave latch coupled to the output signal of the sense amplifier circuitry, wherein the slave latch, the sense amplifier circuitry, the pulse circuitry, the initial resolution circuitry, and the secondary resolution circuitry implement a level-shifting flip flop with a transparent window corresponding to the pulse signal.

4. The apparatus of claim 1, further comprising:
   circuitry configured to generate the input signal at the first voltage level, wherein the circuitry is configured to time borrow from the sense amplifier circuitry by changing the input signal after the active clock edge and during the pulse signal.

5. The apparatus of claim 1, wherein the sense amplifier circuitry includes a first terminal for the output signal and a second terminal for an inverse of the output signal.

6. The apparatus of claim 5, wherein the initial resolution circuitry includes a transistor stack between a supply voltage and the output of the sense amplifier circuitry, wherein the transistor stack includes a first transistor that is controlled by an inverse of the pulse signal and a second transistor that is controlled by a value of the second terminal.

7. The apparatus of claim 5, wherein the secondary resolution circuitry includes first and second pass gates configured to maintain the current value of the output signal using feedback between the first and second terminals, wherein the first and second pass gates are controlled by a signal that represents an end of the pulse signal.

8. A method, comprising:
   generating, by sense amplifier circuitry based on an input signal at a first voltage level, an output signal at a second, different voltage level;
   generating, by pulse circuitry, a pulse signal in response to an active clock edge of a clock signal that is an input to the sense amplifier circuitry;
   driving, by initial resolution circuitry, the output signal of the sense amplifier circuitry to match the value of the input signal during the pulse signal; and
   maintaining, by secondary resolution circuitry, a current value of the output signal after expiration of the pulse signal.

9. The method of claim 8, wherein the driving and maintaining implement static to dynamic converter functionality with a transparent window corresponding to the pulse signal.

10. The method of claim 8, further comprising:
    latching the output signal using a slave latch;
    wherein the driving, maintaining, and latching implement flip flop functionality with a transparent window corresponding to the pulse signal.

11. The method of claim 8, further comprising:
    time borrowing from the sense amplifier circuitry, by circuitry that generates the input signal at the first voltage level, by changing the input signal after the active clock edge and during the pulse signal.

12. The method of claim 8, wherein the driving includes controlling a first transistor with an inverse of the pulse signal and a second transistor with a circuit terminal corresponding to an inverse of the output signal.

13. The method of claim 8, wherein the maintaining includes opening one or more pass gates to provide feedback between output terminals of the sense amplifier circuitry.

14. A non-transitory computer readable storage medium having stored thereon design information that specifies a design of at least a portion of a hardware integrated circuit in a format recognized by a semiconductor fabrication system that is configured to use the design information to produce the circuit according to the design, wherein the design information specifies that the circuit includes:
    sense amplifier circuitry configured to generate, based on an input signal at a first voltage level, an output signal at a second, different voltage level;
    pulse circuitry configured to generate a pulse signal in response to an active clock edge of a clock signal that is an input to the sense amplifier circuitry;

initial resolution circuitry configured to drive the output signal of the sense amplifier circuitry to match the value of the input signal during the pulse signal; and secondary resolution circuitry configured to maintain a current value of the output signal after expiration of the pulse signal.

15. The non-transitory computer readable storage medium of claim 14, wherein the sense amplifier circuitry, the pulse circuitry, the initial resolution circuitry, and the secondary resolution circuitry implement a level-shifting static to dynamic converter with a transparent window corresponding to the pulse signal.

16. The non-transitory computer readable storage medium of claim 14, wherein the design information further specifies that the circuit includes:

a slave latch coupled to the output signal of the sense amplifier circuitry, wherein the slave latch, the sense amplifier circuitry, the pulse circuitry, the initial resolution circuitry, and the secondary resolution circuitry implement a level-shifting flip flop with a transparent window corresponding to the pulse signal.

17. The non-transitory computer readable storage medium of claim 14, wherein the design information further specifies that the circuit includes:

circuitry configured to generate the input signal at the first voltage level, wherein the circuitry is configured to time borrow from the sense amplifier circuitry by changing the input signal after the active clock edge and during the pulse signal.

18. The non-transitory computer readable storage medium of claim 14, wherein the sense amplifier circuitry includes a first terminal for the output signal and a second terminal for an inverse of the output signal.

19. The non-transitory computer readable storage medium of claim 18, wherein the initial resolution circuitry includes a transistor stack between a supply voltage and the output of the sense amplifier circuitry, wherein the transistor stack includes a first transistor that is controlled by an inverse of the pulse signal and a second transistor that is controlled by a value of the second terminal.

20. The non-transitory computer readable storage medium of claim 18, wherein the secondary resolution circuitry includes first and second pass gates configured to maintain the current value of the output signal using feedback between the first and second terminals, wherein the first and second pass gates are controlled by a signal that represents an end of the pulse signal.

\* \* \* \* \*